United States Patent [19]
Watarai

[11] Patent Number: 6,121,792
[45] Date of Patent: Sep. 19, 2000

[54] INPUT CIRCUIT HAVING CURRENT CONTROL

[75] Inventor: Seiichi Watarai, Tokyo, Japan

[73] Assignee: NEC Corporation, Tokyo, Japan

[21] Appl. No.: 09/160,049

[22] Filed: Sep. 25, 1998

[30] Foreign Application Priority Data

Sep. 29, 1997 [JP] Japan ................................. 9-264299

[51] Int. Cl.$^7$ ............................................. H03K 19/0175
[52] U.S. Cl. .................. 326/65; 326/81; 326/84
[58] Field of Search ............................. 326/63–65, 80, 326/81, 84

[56] References Cited

U.S. PATENT DOCUMENTS

| | | | |
|---|---|---|---|
| 5,289,056 | 2/1994 | Keown et al. | 326/84 |
| 5,739,726 | 4/1998 | Ling | 326/81 |
| 5,812,014 | 9/1998 | Mazzucco et al. | 327/531 |

*Primary Examiner*—Michael Tokar
*Assistant Examiner*—Don Phu Le
*Attorney, Agent, or Firm*—McGinn & Gibb, P.C.

[57] ABSTRACT

To provide an input circuit of an IC wherein the current flowing towards the input terminal when receiving a LOW level signal can be restricted to minimum, and the input threshold level can be controlled appropriately without degrading transition performance of the input circuit, an input circuit includes: a current control means for controlling a first current to be supplied to a first node according to a second current to be supplied to a second node an input level transfer means for transferring logic of the external logical signal into an intermediate signal whereof potential of a HIGH level is restricted within a power supply voltage; a level shift means for shifting a LOW level of the intermediate signal to substantially the same level of a LOW level of the external logical signal; an inverter for outputting a signal of low output impedance by inverting the shifted intermediate signal; and a transition current generating means for controlling the level shift means to supply a sufficient transition current for turning the inverter at a high-speed when the external signal turns from the LOW level to the HIGH level.

20 Claims, 3 Drawing Sheets

INPUT CIRCUIT HAVING CURRENT CONTROL

BACKGROUND OF THE INVENTION

The present invention relates to an input circuit of an IC (Integrated Circuit) for receiving data signals from outside the IC.

The input circuit is used for receiving data signals exchanged among different ICs by way of bus-lines, for example, and receives either a HIGH level signal or a LOW level signal when logical signals are exchanged among the ICs. The input circuit of an IC has an input terminal for receiving data signals from outside the IC and an output terminal for transferring the received signals inside the IC.

Concerning the logical signal exchange among ICs, signal levels are standardized so that the HIGH level or the LOW level of a signal may be discriminated commonly, and every signal is exchanged according to the standard. According to the TTL (Transistor Transistor Logic) interface standard, for example, the minimum voltage of the HIGH level signal to be exchanged (hereinafter abbreviated as the VOHMIN) is defined to be 2.4V and the maximum voltage of the LOW level signal to be exchanged (hereinafter abbreviated as the VOLMAX) is defined to be 0.4V.

However, the maximum voltage of the HIGH level signal to be exchanged (hereinafter abbreviated as the VOHMAX) or the minimum voltage of the LOW level signal to be exchanged (hereinafter abbreviated as the VOLMIN) is not defined in the TTL interface standard. Therefore, in almost every IC, a potential level near the maximum power supply voltage is used as the HIGH level signal and a potential level near the ground voltage is used as the LOW level signal. This situation is the same for ICs designed according to the conventional CMOS interface, that is, their VOHMAXs and the VOLMINs have been determined according to their power supply voltages and the ground voltages.

However, the power supply voltage of the ICs has been lowered along with progress of their fine integration, and hence, there have arisen cases where ICs of different power supply voltages (5V and 3V, for example) should be used in combination. In these cases, different power supply voltages must be supplied for each IC, so that circuit elements comprised in the IC of the lower power supply voltage may not be broken by a power supply voltage higher than their tolerance. As a consequence, data signals of two different VOHMAXs, one near 5V and the other near 3V, in the example, may be exchanged between the ICs, because the ICs are defined to be sufficient at least when their VOHMINs and the VOLMAXs are conformed to the standard such as defined in the above described TTL interface.

As above described, circuit elements of an IC designed to work with 3V may be broken when 5V is supplied as a power supply to the IC. In the same way, when data signals of the VOHMAX about 5V are received by an input circuit of an IC of 3V, elements of the input circuit may be broken when there is no countermeasure is taken.

Therefore, the input circuit of an IC designed to work with a low power supply voltage, 3V, for example, should be so configured that it can receive signals delivered from another IC working with a high power supply voltage, 5V, for example, without breaking its element.

Figure 3:
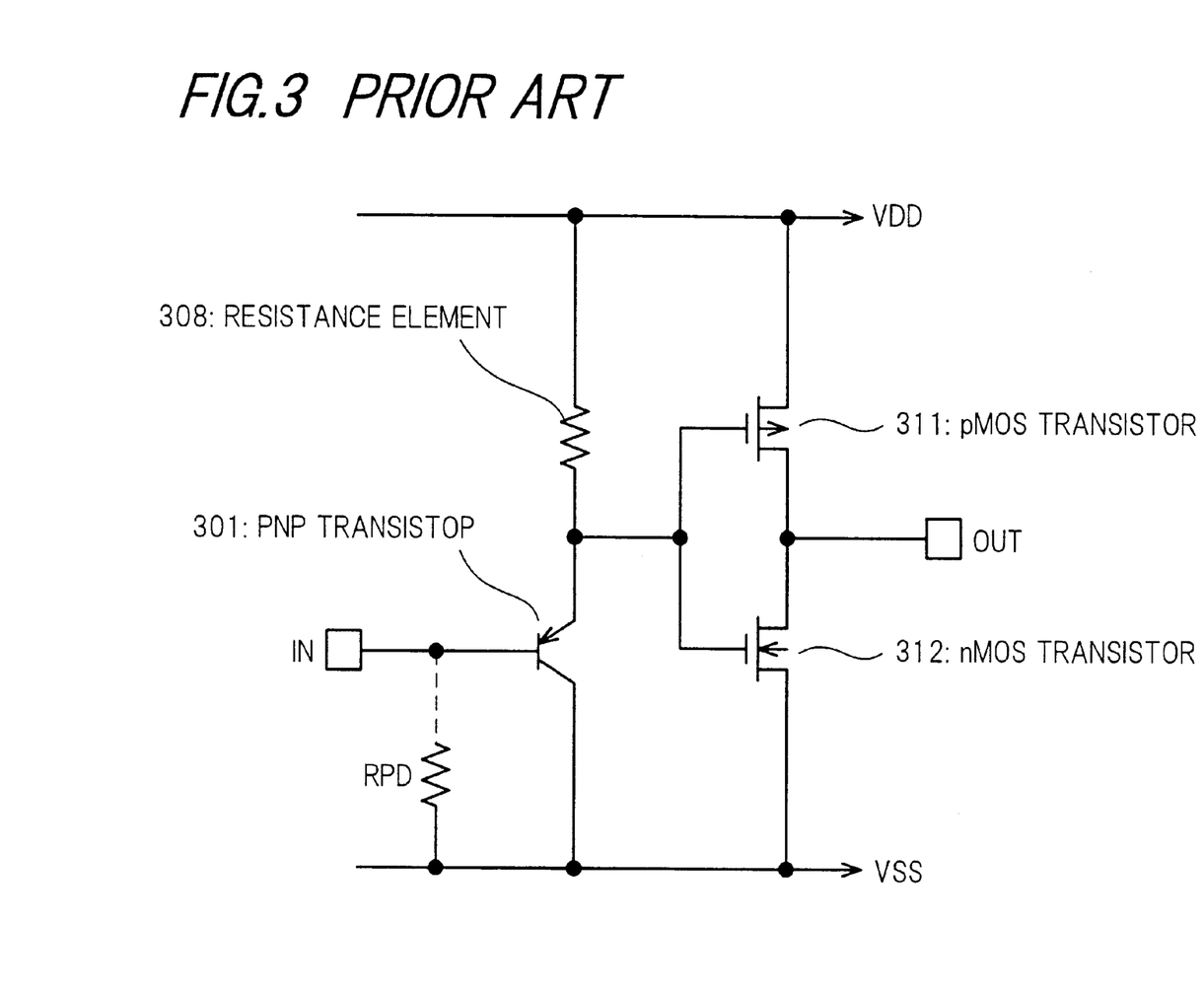
FIG. 3 is a circuit diagram illustrating a conventional input circuit of an IC.

FIG. 3 is a circuit diagram illustrating a conventional input circuit of an IC for receiving data signals of the VOHMAX higher than its power supply voltage.

In the input circuit of FIG. 3, an input terminal IN is connected to a base of a PNP transistor 301. An emitter of the PNP transistor 301 is connected to a ground terminal VSS and a collector thereof is connected to a power supply VDD through a resistance element 308. The collector of the PNP transistor 308 is coupled to gates of a pMOS transistor 311 and an nMOS transistor 312. A source of the pMOS transistor 311 is connected to the power supply VDD and a drain thereof is coupled to an output terminal OUT and a drain of the nMOS transistor 312, whereof a source is connected to the ground terminal VSS.

In a case where a power supply voltage, 3V, for example, is supplied between the power supply terminal VDD and the ground terminal VSS, and a HIGH level signal, 5V, for example, higher than the power supply voltage is impressed to the input terminal IN from another IC working with 5V supply.

In this case, the base-emitter voltage of the PNP transistor 301 becomes backward-biased, and the PNP transistor 301 is made OFF. Hence, the emitter of the PNP transistor 301 is cut from the potential of the input terminal IN, and the gates of the pMOS transistor 311 and the nMOS transistor 312, which compose a CMOS inverter, are supplied with the power supply voltage of 3V through the resistance element 308. Thus, degradation of the gate oxidation film, which may occur when the gates of the pMOS transistor 311 and the nMOS transistor 312 are connected directly to the input terminal IN, is prevented.

The pMOS transistor 311 being made OFF and the nMOS transistor 312 being made ON in the CMOS inverter, potential of the output terminal OUT is shifted to the ground voltage in this case, which is transferred to inner circuits of the IC as the LOW level signal indicating inverse logic of the signal received through the input terminal IN.

When a LOW level signal near the ground voltage is impressed to the input terminal IN, it is supplied to the base of the PNP transistor 301 whereof the emitter is supplied with the power supply voltage of 3V through the resistance element 308. Hence, the base-emitter voltage being forward-biased, the PNP transistor 301 becomes ON, and gate potential of the CMOS inverter is lowered near the ground voltage. The pMOS transistor 311 made ON and the nMOS transistor 312 made OFF, the potential of the output terminal OUT is shifted to the power supply voltage of 3V in this case, which is transferred to the inner circuits as the HIGH level signal indicating inverse logic of the signal received through the input terminal IN.

Also in this case, there is no problem in the degradation of gate oxidation film, which may occur when a VOLMIN too much lower than the ground voltage is impressed directly to the gates of the CMOS inverter.

As to the PNP transistor 301, a lateral type PNP transistor is used, wherein high endurance, about 10 to 20V, can be obtained against the base-emitter and the base-collector voltage difference. The lateral type PNP transistor has also merit in that it can be easily configured on an IC chip with ordinary CMOS or BiCMOS fabrication processes.

As described, above the problem of the degradation of gate oxidation film of the pMOS transistor 311 and the nMOS transistor 312 is prevented in the conventional input circuit of FIG. 3 even when a HIGH level signal higher than the power supply voltage is supplied to the input terminal IN, by providing the PNP transistor 301 having the base connected to the inpit terminal IN and the emitter supplied with the power supply voltage through the resistance element 308 and connected to the gates of the pMOS transistor 311 and the nMOS transistor 312.

However, in the conventional input circuit of FIG. 3, there is a problem of a current flowing through the base of the PNP transistor 310, as will be described i the following paragraphs.

When a LOW level signal near the ground voltage is run into the input terminal IN, the PNP transistor 301 is made ON. The resistance value of the resistance element 308 is generally set to be about 1 to 10KΩ to ensure high-speed switching of the CMOS inverter. Therefore, the emitter current of the PNP transistor 301 becomes about 0.3 to 3 mA, when the power supply voltage is 3V.

A part of the emitter current flows out through the base of the PNP transistor 310, as the base-emitter voltage is forward-biased when the LOW level signal is impressed there. The forward current-gain of the lateral type transistor is generally small and often shows a value smaller than 10 times, even one time when fabrication processes are not sufficiently controlled. When the forward current-gain is one time, it means the same current flows out through the base with the current flowing through the collector, that is, a half of the emitter current of the PNP transistor 301.

In the input circuit for receiving external signals, its input terminal may be left open receiving neither of the HIGH level signal nor the LOW level signal. When the input terminal is left open, the logical level of the input terminal becomes unstable. Therefore, there is usually provided a resistance element (hereinafter called the pull-up resistor) connected between the input terminal and the power supply terminal (hereinafter called the pull-down resistor) or connected between the input terminal and the ground terminal, for defining the logical level of the input terminal either to the HIGH level or the LOW level. In the input circuit in which it is possible to receive a HIGH level signal higher than the power supply voltage, the high voltage of the input signal may leak to the inner circuit by way of the power supply terminal, in case the pull-up resistor is provided. Therefore, the pull-down resistor is usually provided, such as a pull-down resistor RPD of the input circuit of FIG. 3 connected between the input terminal IN and the ground terminal VSS. As to the pull-down resistor, comparatively high resistance value about 10 to 50KΩ is selected, for retaining sufficient input impedance.

When output impedance of the external LOW level signal supplied to the input terminal IN is not sufficiently low, the base current above described flows through the pull-down resistor RPD, which may push the base potential, and consequently, the emitter potential of the PNP transistor 301, until it is higher than the threshold voltage of the CMOS inverter, and potential of the output terminal OUT may be turned to the ground voltage even when a LOW level signal is supplied to the input terminal IN. This is a problem of the conventional input circuit of FIG. 3.

This problem might be prevented by enlarging the resistance value of the resistance element 308 of FIG. 3. However, when the resistance value of the resistance element 308 is enlarged, it cannot supply sufficient currents to the gates of the pMOS transistor 311 and the nMOS transistor 312, when the input signal is turned from the LOW level to the HIGH level, in order to charge the gate electrodes against their parasitic capacitances for turning the CMOS inverter within a transition time sufficiently short.

Besides the above problem of the current flowing through the base of the PNP transistor 301, there is also a problem of a discrimination level, or an input threshold level, between the HIGH level and the LOW level, in the conventional input circuit of FIG. 3.

The input threshold level, wherefrom the input signal is discriminated to be either at the HIGH level or at the LOW level, is preferably set at a medium point of the VOHMIN (0.4V) and the VOLMAX (2.4V), that is, at 1.4V when the IC is designed according to the TTL interface standard, for obtaining maximum margin against signal distortion because of external noise or against variation of the power supply voltage. This input threshold level can be controlled by changing gate width ratio of the pMOS transistor 311 and the nMOS transistor 312. For example, when the pMOS transistor 311 and the nMOS transistor 312 have the same size, the output terminal OUT becomes at the HIGH level when their gate potential is lower than a half (1.5V) of the power supply voltage and otherwise becomes at the LOW level. When the gate width of the pMOS transistor 311 is made wider than that of the nMOS transistor 312, the output terminal OUT becomes to turn to the LOW level with gate potential higher than 1.5V. On the contrary, the output terminal OUT becomes to turn to the HIGH level with gate potential lower than 1.5V when the gate width of the nMOS transistor 312 is made wider than that of the pMOS transistor 311.

Returning to the input circuit of FIG. 3, the gate potential of the pMOS transistor 311 and the nMOS transistor 312 becomes higher than potential of the input signal supplied to the base of the PNP transistor 301 by base-emitter voltage difference VEBP1 of the PNP transistor 301. Therefore, the input threshold level at the input terminal IN becomes 1.5V (a half of the power supply voltage) −VEBP1, when the pMOS transistor 311 and the nMOS transistor 312 have the same size.

This input threshold level can be shifted to the medium point (1.4V) of the VOHMIN and the VOLMAX, by designing the gate width of the pMOS transistor 311 appropriately wider than the gate width of the nMOS transistor 312. However, when the gate width of the pMOS transistor 311 is made wider, the parasitic capacitance thereof is made larger in proportion to the gate width, which needs longer time for charging, resulting in degradation of the transistion performance. This is another problem of the conventional input circuit of FIG. 3.

SUMMARY OF THE INVENTION

Therefore, a primary object of the present invention is to provide an input circuit of an IC wherein the current flowing towards the input terminal when receiving a LOW level signal can be restricted to minimum, and the input threshold level can be controlled appropriately without degrading transition performance of the input circuit.

In order to achieve the object, an input circuit of an IC according to the invention comprises a current control means connected to a power supply terminal for controlling a first current to be supplied to a first node according to a second current to be supplied to a second node, an input level transfer means connected between the first node and a ground terminal for transferring logic of the external logical signal to the first node as an intermediate signal whereof potential of a HIGH level is restricted within potential of the power supply terminal, a level shift means connected between the second node and a third node for transferring logic of the intermediate signal to the third node by shifting a LOW level of the intermediate signal to substantially the same level with a LOW level of the external logical signal, a reference current generating means connected between the third node and the ground terminal for determining a current value of the second current, an inverter circuit for outputting a signal having inverse logic of the logic transferred to the third node with low output impedance to be supplied to the inner circuits, and a transition current generating means for controlling the level shift means to supply a sufficient transition current to the third node for turning the inverter circuit at a high-speed when the external signal turns from the LOW level to the HIGH level.

Therefore, the problem of shift of the input threshold level of the conventional input circuit of FIG. 3 is eliminated by the level shift means, and the problem of the base current flowing through the lateral transistor of low current gain is resolved without degradation of transistion performance with the current control means in combination with the transition current generating means.

The level transfer means comprises a PNP transistor having a base connected to an input terminal whereto the external logical signal is supplied, an emitter connected to the first node, and a collector connected to the ground terminal.

The level shift means comprises a first NPN transistor having a base connected to the first node, a collector connected to the second node, and an emitter connected to the third node.

The current control means comprises a first pMOS transistor having a source connected to the power supply terminal through a first current restricting means, a drain connected to the first node and a gate connected to the second node; and a second pMOS transistor having a source connected to the power supply terminal, a drain and a gate connected to the second node.

The transition current generating means comprises a first nMOS transistor having a drain connected to the power supply terminal through a second current restricting means, a source connected to the ground terminal and a gate connected to the third node, a third pMOS transistor having a source connected to the source of the first pMOS transistor, a drain connected to the first node and a gate connected to the drain of the first nMOS transistor, and a fourth pMOS transistor having a source connected to the power supply terminal, a drain connected to the second node and a gate connected to the drain of the first nMOS transistor.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
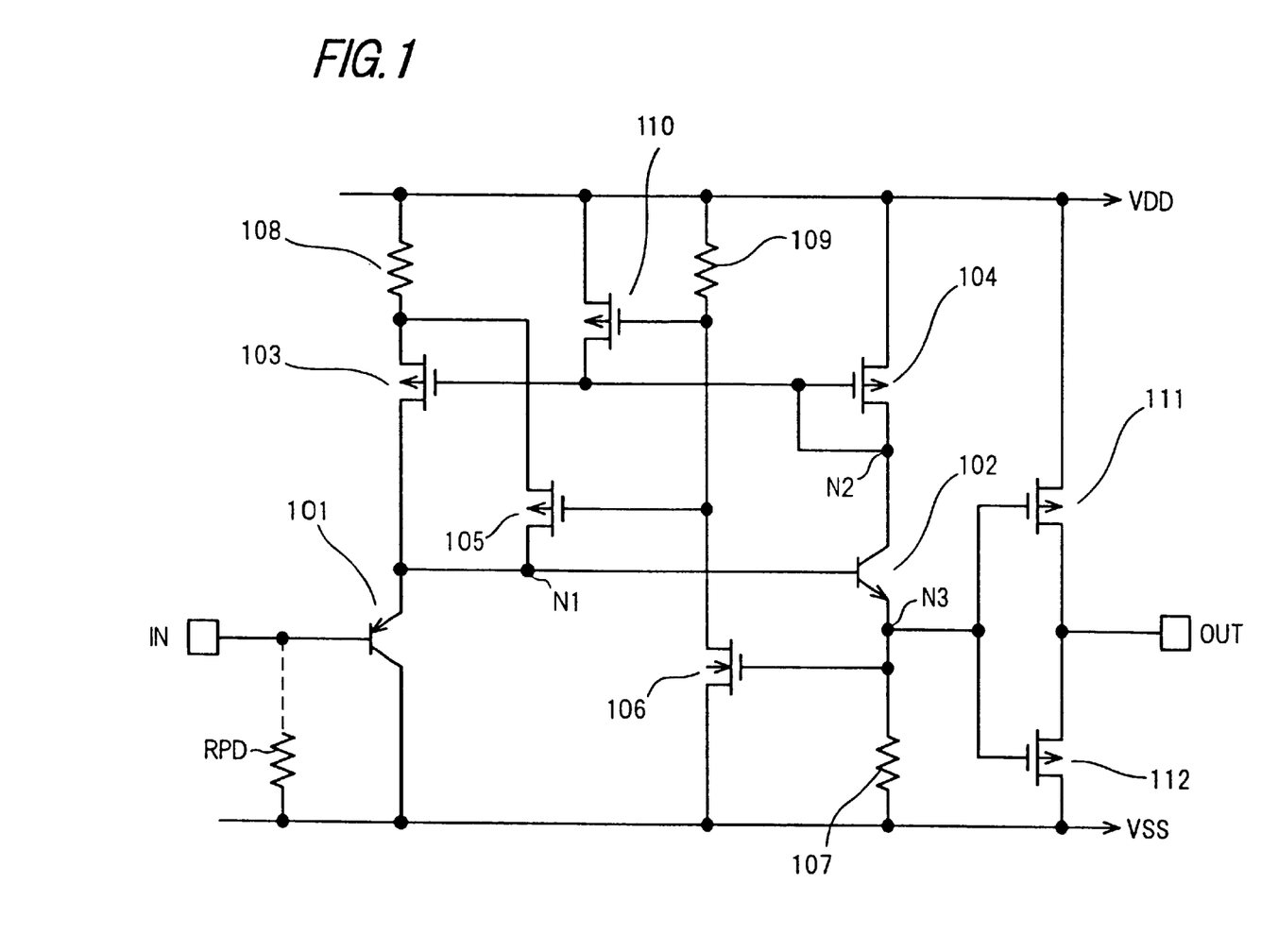
FIG. 1 is a circuit diagram illustrating an input circuit according to a first embodiment of the invention.

FIG. 1 is a circuit diagram illustrating an input circuit according to a first embodiment of the invention. Referring to FIG. 1, the input circuit comprises;

a PNP transistor 101 having a base connected to an input terminal IN, a collector connected to a ground terminal VSS and an emitter connected to a first node N1, an NPN transistor 102 having a base connected to the first node N1, a collector connected to a second node N2 and an emitter connected to a third node N3, a first and a second pMOS transistor 103 and 104, gates thereof conntected to the second node N2 together with a drain of the second pMOS transistor 104, a drain of the first pMOS transistor 103 connected to the first node N1, a source of the first pMOS transistor 103 connected to the power supply terminal VDD through a first resistance element 108 and a source of the second pMOS transistor 104 connected to the power supply terminal VDD, a first nMOS transistor 106, a gate thereof connected to the third node N3, a source thereof connected to the ground terminal VSS and a drain thereof connected to the power supply terminal VDD through a second resistance element 109, a third pMOS transistor 105, a gate thereof connected to the drain of the first nMOS transistor 106, a source thereof connected to the source of the first pMOS transistor 103 and a drain thereof connected to the first node N1, a fourth pMOS transistor 110, a gate thereof connected to the drain of the first nMOS transistor 106, a source thereof connected to the power supply terminal VDD and a drain thereof connected to the second node N2, a serial connection of a fifth pMOS transistor 111 and a second nMOS transistor 112, gates thereof connected to the third node N3, drains thereof connected to an output terminal OUT, a source of the fifth pMOS transistor 111 connected to a power supply terminal VDD and a source of the second nMOS transistor 112 connected to the ground terminal VSS, a third resistance element 107 connected between the third node N3 and the ground terminal VSS, and a pull-down resistor RPD connected between the input terminal IN and the ground terminal VSS.

Now, operation of the embodiment is described.

The first PNP transistor 101 operates as an input level transfer means for transferring logic of input signals supplied to the input terminal IN to the first node N1, that is, the base of the first NPN transistor 102.

When a power supply voltage of 3V, for example, is supplied between the power supply terminal VDD and the ground terminal VSS, and a LOW level signal near the ground voltage is supplied to the input terminal IN, the PNP transistor 101 becomes ON. Here, the serial connection of the first resistance element 108 and the first pMOS transistor 103 operates as a current source for supplying a controlled current to the first node N1, which will be described afterwards.

Therefore, the potential of the first node N1, connected to the emitter of the first PNP transistor 101, becomes equal to the potential VIL of the input terminal IN (the ground voltage)+base-emitter voltage VEB1 of the PNP transistor 101.

The potential of the first node N1 is supplied to the base of the NPN transistor 102 whereof emitter size is designed to be larger than the emitter size of the PNP transistor 101. Therefore, the potential of the third node N3 becomes equal to the potential of the node N1−base-emitter voltage VBE2 of the NPN transistor 102, that is, VIL+VEB1−VBE2. Thus, the NPN transistor 102 operates as a level shift means for shifting potential level of the first node N1, representing logical signals transferred from the input level transfer means, to a potential level substantially the same with that of the input terminal IN.

The fifth pMOS transistor 111 and the second nMOS transistor 112 operate as a CMOS inverter in the same way with the pMOS transistor 311 and the nMOS transistor 312 of FIG. 3. The fifth pMOS transistor 111 made ON and the second nMOS transistor 112 made OFF by the potential of the third node N3, a HIGH level signal having the same potential with the power supply terminal VDD is output from the output terminal OUT to be transferred to the inner circuits as inverse logic of the input signal received through the input terminal IN.

Here, the problem of the input threshold level such as beforehand described in connection with the conventional input circuit of FIG. 3 does not occur in the input circuit of FIG. 1, since the potential level of the third node N3 is shifted to substantially the same potential level with that of the input terminal IN by the level shift means. Therefore, there is no need to control the input threshold level by making wide the gate width of the pMOS transistor 101, for example, for retaining sufficient margin against the external noise or the variation of the power supply voltage.

Now, the problem of the current flowing towards the input terminal IN and the pull-down resistor RPD is considered.

As above described, the emitter size of the NPN transistor 102 is designed to be larger than that of the PNP transistor 101. Therefore following relation stands.

$$VEB1 > VBE2 \tag{1}$$

So, the potential VE2 of the emitter of the NPN transistor 102, or the third node N3, becomes as follows, when the potential VIL of the input terminal is equal to the ground voltage (0V).

$$VE2 = VEB1 - VBE2 \tag{2}$$

Hence, following current IR7 flows through the third resistance element 107, R7 being resistance value of the third resistance element 107.

$$IR7 = (VEB1 - VBE2)/R7 \tag{3}$$

Between the collector current IC2 and the emitter current IE2 of the NPN transistor 102, following equation stands, β2 being current gain of the NPN transistor 102.

$$IC2 = IE2 \times \{\beta2/(\beta2+1)\} \tag{4}$$

The emitter current IE2 is the same with the current IR7 flowing through the third resistance element 107. Therefore, when the current gain β2 is sufficiently large, 100 to 200, for example, following equation stands.

$$IR7 = IE2 \approx IC2 \tag{5}$$

When the potential VE2 of the third node N3 is sufficiently low, the first nMOS transistor 106, and consequently, the third and the fourth pMOS transistor 105 and 110 are OFF. Therefore, the collector current IC2 of the NPN transistor 102 is the same with the drain current IP4 of the second pMOS transistor 104.

Now, the relation between the drain current IP3 of the first pMOS transistor 103 and the drain current IP4 of the second pMOS transistor 104 is described.

Gates of the first and second pMOS transistor 103 and 104 is coupled. Therefore, a following equation stands.

$$VGSP4 = VGSP3 + IP3 \times R8, \tag{6}$$

where VGSP3 and VGSP4 are the gate-source voltages of the first and the second pMOS transistor 103 and 104, respectively, and R8 is resistance value of the first resistance element 108.

The gate-source voltages VGSP3 and VGSP4 are given by following equations.

$$VGSP3 = (2 \times IP3/\beta3)^{1/2} + VTP3 \tag{7}$$

$$VGSP4 = (2 \times IP4/\beta4)^{1/2} + VTP4 \tag{8}$$

Here, VTP3 and VTP4 are threshold voltages of the first and the second pMOS transistor 103 and 104, respectively, and $\beta3 = \mu \times CO \times (W3/L)$ and $\beta4 = \mu \times CO \times (W4/L)$, $\mu$, CO and L being the mobility, the unit capacitance of the gate oxidation film and the gate length of the first and the second pMOS transistor 103 and 104, respectively, and W3 and W4 being gate widths of the first and the second pMOS transistor 103 and 104, respectively.

Substituting equations (7) and (8) into equation (6), following equation is obtained.

$$(2 \times IP4/\beta4)^{1/2} + VTP4 = (2 \times IP3/\beta3)^{1/2} + VTP3IP3 \times R8 \tag{9}$$

Therefore, the relation between the drain current IP3 and IP4 of the first and the second pMOS transistor 103 and 104 is represented by following equation, when VTP4≈VTP3.

$$IP4 = \frac{1}{2}(IP3 \cdot R8\sqrt{\beta4} + \sqrt{2IP3\beta4/\beta3})^2. \tag{10}$$

The above equation (10) shows that the current value of the drain current IP3 of the first pMOS transistor 103, for a certain value of the drain current IP4 of the second pMOS transistor 104, can be controlled by changing the resistance value R8 of the first resistance element 108, and β3 and β4, that is, gate widths of the first and the second pMOS transistor 103 and 104.

Thus, the first and the second pMOS transistor 103 and 104 and the first resistance element 108 operate as a current control means for supplying a controlled current to the first node N1, that is, to the emitter of the PNP transistor 101.

Hence, by appropriately preparing the resistance value of the first resistance element 108 and the gate widths of the first and the second pMOS transistor 103 and 104, the base current of the PNP transistor 101 flowing through the pull-down resister RPD can be so restricted that the potential of the input terminal IN receiving a LOW signal does not become too high thereby, even if the current gain of the lateral transistor used to the PNP transistor 101 is low, in the input circuit according to embodiment.

Now, operation of the input circuit of FIG. 1 when a HIGH level signal higher (5V, for example) than the power supply voltage (3V) is supplied to the input terminal IN.

In this case, the base-emitter voltage of the PNP transistor 101 becomes backward-biased. Therefore, the potential of the first node N1, and consequently, the potential of the third node N3 is raised up with the current supplied through the current control means, that is, through the first pMOS transistor 103. When the potential of the third node N3 becomes higher than the threshold voltage of the first nMOS transistor 106, it turns to ON, and gate potential of the third and the fourth pMOS transistor 105 and 110 is lowered by the current flowing through the second resistance element 109, making ON the third and the fourth pMOS transistor 105 and 110. The first node N1 and the second node N2, that is, the collector and the base of the NPN transistor 102 being supplied with the power supply voltage, the potential of the third node N3 is shifted to the power supply voltage—the base-emitter voltage VBE2, turning the CMOS inverter with a transition time sufficiently short, and without problem of the gate oxidation film degradation.

The fifth pMOS transistor 111 made OFF and the second nMOS transistor 112 made ON by the potential of the third node N3, a LOW level signal having the same potential with the ground terminal VSS is output from the output terminal OUT to be transferred to the inner circuits as inverse logic of the input signal received through the input terminal IN.

Thus, the first nMOS transistor 106, the third and the fourth pMOS transistors 105 and 110, and the second resistance element 109 operate as a transition current generating means.

As heretofore described, by providing the level shift means, the problem of shift of the input threshold level of the conventional input circuit of FIG. 3 is eliminated, and by providing the current control means and the transition current generating means, the problem of the base current flowing through the lateral transistor of low current gain is resolved without degradation of transition performance, in the input circuit of the embodiment.

However, both the current control means and the transition current generating means do not operate when no current flows through the second pMOS transistor 104. There may be an instantaneous break of the power supply in the IC. In the case, or also in the initialization of the IC, just after raise of the power supply voltage, the NPN transistor 102 may be left in an OFF status, and the potential of the second node may be left at the ground voltage even when a HIGH level signal is supplied to the input terminal IN, without any reference current flowing through the third resistance element 107.

For dealing with this problem, an initial current generating means may be further provided.

Figure 2:
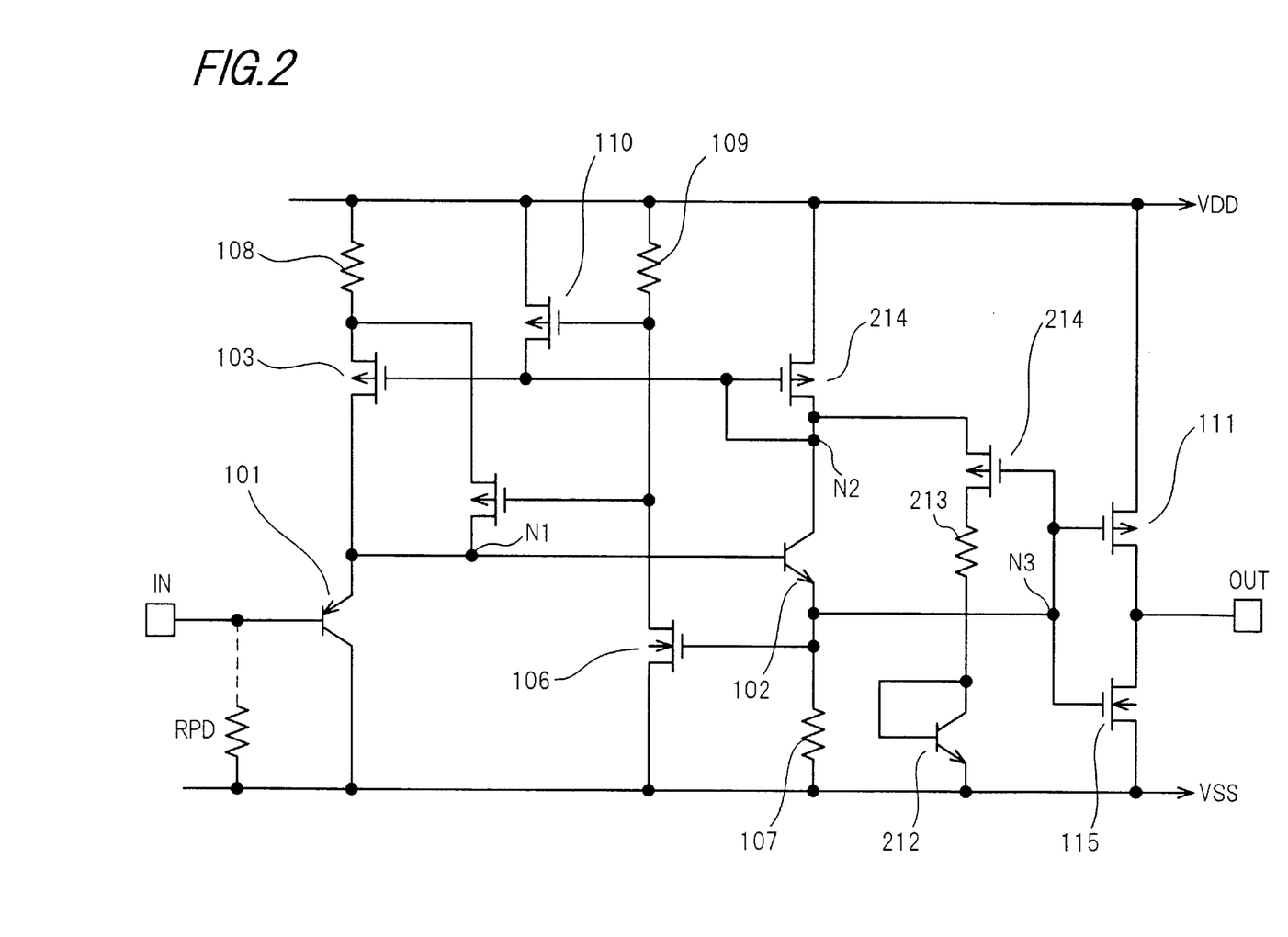
FIG. 2 is a circuit diagram illustrating an input circuit according to a second embodiment of the invention.

FIG. 2 is a circuit diagram illustrating an input circuit according to a second embodiment of the present invention, wherein an initial current generating means, comprising a sixth pMOS transistor 214, a fourth resistance element 213 and a second NPN transistor 212, is further provided to the circuit configuration of FIG. 1.

The sixth pMOS transistor 214 has a source connected to the second node N2, a gate connected to the third node N3 and a drain connected to an end of the fourth resistance element 213. The second NPN transistor 212 has an emitter connected to the ground terminal VSS and a base and a collector connected to the other end of the fourth resistance element 213.

The other components of the input circuit of FIG. 2 is the same with the input circuit of FIG. 1 and operate in the same way when the power supply voltage is stably supplied. Therefore, duplicated description is omitted.

Just after the power supply is raised up, the NPN transistor 102 is left OFF and no reference current flows through the third resistance element 107. Hence, the potential of the third node N3 remains at the ground voltage, as above described. However, with the ground voltage of the third node N3 connected to the gate the sixth pMOS transistor 214, the sixth pMOS transistor 214 becomes ON in the input circuit of FIG. 2, and a certain current defined with the fourth resistance element 213 flows through the second pMOS transistor 104, which makes the current control means operate even just after the raise-up of power supply voltage and a necessary current for making ON the NPN transistor 102 is supplied to the first node N1 through the first pMOS transistor 103. Here, the potential of the second node N2 is pushed up higher than the base-emitter voltage of the second NPN transistor 212, so that the NPN transistor 102 may not be saturated.

Thus, in the input circuit of FIG. 2 according to the second embodiment of the invention, the current control means can operate normally even just after the power supply voltage is raised up.

Heretofore, the present invention is described in connection with the embodiments of FIGS. 1 and 2. However, the scope of the invention is not limited in these embodiments. For example, the third node N3 is connected to a CMOS inverter consisting of the fifth pMOS transistor 111 and the second nMOS transistor 115 in the embodiments. However, the CMOS inverter may be replaced with a buffer circuit for outputting inner signals having the same logic with the external signals supplied to the input terminal IN. The input circuit may be designed to work with a power supply voltage of 5V for receiving a HIGH level signal of 10V, or, MOS transistors may be used as any of the first to the fourth resistance elements 107 to 109 and 213.

What is claimed is:

1. An input circuit for transferring an external logical signal into inner circuits, said input circuit comprising:

a current control means connected to a power supply terminal for controlling a first current to be supplied to a first node according to a second current to be supplied to a second node;

an input level transfer means connected between the first node and a ground terminal for transferring logic of the external logical signal to the first node as an intermediate signal whereof potential of a HIGH level is restricted within potential of the power supply terminal;

a level shift means connected between the second node and a third node for transferring logic of the intermediate signal to the third node by shifting a LOW level of the intermediate signal to substantially the same level with a LOW level of the external logical signal;

a reference current generating means connected between the third node and the ground terminal for determining a current value of the second current; and a transition current generating means for controlling the level shift means to supply a sufficient transition current to the third node.

2. The input circuit as recited in claim 1, said input level transfer means comprising:

a PNP transistor having a base connected to an input terminal whereto the external logical signal is supplied;

an emitter connected to the first node; and a collector connected to the ground terminal.

3. The input circuit as recited in claim 1, said level shift means comprising:

a first NPN transistor having a base connected to the first node;

a collector connected to the second node; and an emitter connected to the third node.

4. The input circuit as recited in claim 1, wherein the reference current generating means comprises a resistor.

5. The input circuit as recited in claim 1, wherein current generating means comprises a MOS transistor.

6. The input circuit for transferring an external logical signal into inner circuits, said input circuit comprising:

a current control means connected to a power supply terminal for controlling a first current to be supplied to a first node according to a second current to be supplied to a second node;

an input level transfer means connected between the first node and a ground terminal for transferring logic of the external logical signal to the first node as an intermediate signal whereof potential of a HIGH level is restricted within potential of the power supply terminal;

a level shift means connected between the second node and a third node for transferring logic of the intermediate signal to the third node by shifting a LOW level of the intermediate signal to substantially the same level with a LOW level of the external logical signal;

a reference current generating means connected between the third node and the ground terminal for determining a current value of the second current;

an inverter circuit for outputting a signal having inverse logic of the logic transferred to the third node with low output impedance to be supplied to the inner circuits; and a transition current generating means for controlling the level shift means to supply a sufficient transition current to the third node for turning the inverter circuit at a high-speed when the external signal turns from the LOW level to the HIGH level.

7. The input circuit as recited in claim 6, said transition current generating means comprising:

a first nMOS transistor having a drain connected to the power supply terminal through a second current restricting means, a source connected to the ground terminal and a gate connected to the third node;

a third pMOS transistor having a source connected to tile source of the first pMOS transistor, a drain connected to the first node and a gate connected to the drain of the first nMOS transistor; and a fourth pMOS transistor having a source connected to the power supply terminal, a drain connected to the second node and a gate connected to the drain of the first nMOS transistor.

8. The input circuit as recited in claim 7, wherein the second current restricting means comprises a resistor.

9. The input circuit as recited in claim 7, wherein the second current restricting means comprises a MOS transistor.

10. The input circuit for transferring an external logical signal into inner circuits, said input circuit comprising:

a current control means connected to a power supply terminal for controlling a first current to be supplied to a first node according to a second current to be supplied to a second node;

an input level transfer means connected between the first node and a ground terminal for transferring logic of the external logical signal to the first node as an intermediate signal whereof potential of a HIGH level is restricted within potential of the power supply terminal;

a level shift means connected between the second node and a third node for transferring logic of the intermediate signal to the third node by shifting a LOW level of the intermediate signal to substantially the same level with a LOW level of the external logical signal;

a reference current generating means connected between the third node and the ground terminal for determining a current value of the second current;

a buffer circuit for outputting a signal having the same logic of the logic transferred to the third node with low output impedance to be supplied to the inner circuits; and a transition current generating means for controlling the level shift means to supply a sufficient transition current to the third node for turning the buffer circuit on at a high-speed when the external signal turns from the LOW level to the HIGH level.

11. The input circuit as recited in claim 10, said transition current generating means comprising:

a first nMOS transistor having a drain connected to the power supply terminal through a second current restricting means, a source connected to the ground terminal and a gate connected to the third node;

a third pMOS transistor having a source connected to the source of the first pMOS transistor, a drain connected to the first node and a gate connected to the drain of the first nMOS transistor; and a fourth pMOS transistor having a source connected to the power supply terminal, a drain connected to the second node and a gate connected to the drain of the first nMOS transistor.

12. The input circuit as recited in claim 11, wherein the second current restricting means comprises a resistor.

13. The input circuit as recited in claim 11, wherein the second current restricting means comprises a MOS transistor.

14. The input circuit for transferring an external logical signal into inner circuits, said input circuit comprising:

a current control means connected to a power supply terminal for controlling a first current to be supplied to a first node according to a second current to be supplied to a second node;

an input level transfer means connected between the first node and a ground terminal for transferring logic of the external logical signal to the first node as an intermediate signal whereof potential of a HIGH level is restricted within potential of the power supply terminal;

a level shift means connected between the second node and a third node for transferring logic of the intermediate signal to the third node by shifting a LOW level of the intermediate signal to substantially the same level with a LOW level of the external logical signal;

a reference current generating means connected between the third node and the ground terminal for determining a current value of the second current; and an initial current generating means for generating an initial current flowing from the second node to the ground terminal in order to activate the current control means even when a current flowing through the reference current generating means is cut by the level shift means.

15. The input circuit as recited in claim 14, said initial current generating means comprising:

a fifth pMOS transistor having a source connected to the second node and a gate connected to the third node;

a third current restricting means whereof an end is connected to a drain of the fifth pMOS transistor; and a second NPN transistor having a base and a collector connected to the other end of the third current restricting means and an emitter connected to the ground terminal.

16. The input circuit as recited in claim 15, wherein the third current restricting means comprises a resistor.

17. The input circuit as recited in claim 15, wherein the third current restricting means comprises a MOS transistor.

18. The input circuit for transferring an external logical signal into inner circuits, said input circuit comprising:

a current control means connected to a power supply terminal for controlling a first current to be supplied to a first node according to a second current to be supplied to a second node;

an input level transfer means connected between the first node and a ground terminal for transferring logic of the external logical signal to the first node as an intermediate signal whereof potential of a HIGH level is restricted within potential of the power supply terminal;

a level shift means connected between the second node and a third node for transferring logic of the intermediate signal to the third node by shifting a LOW level of the intermediate signal to substantially the same level with a LOW level of the external logical signal; and a reference current generating means connected between the third node and the ground terminal for determining a current value of the second current, wherein said current control means comprises:

a first pMOS transistor having a source connected to the power supply terminal through a first current restricting means, a drain connected to the first node and a gate connected to the second node; and a second pMOS transistor having a source connected to the power supply terminal, a drain, and a gate connected to the second node.

19. The input circuit as recited in claim 18, wherein the first current restricting means comprises a resistor.

20. The input circuit as recited in claim 18, wherein the first current restricting means comprises a MOS transistor.

* * * * *